United States Patent
Li

(10) Patent No.: US 10,347,493 B2
(45) Date of Patent: Jul. 9, 2019

(54) TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 147 days.

(21) Appl. No.: 15/435,557

(22) Filed: Feb. 17, 2017

(65) Prior Publication Data
US 2017/0301545 A1 Oct. 19, 2017

(30) Foreign Application Priority Data
Apr. 14, 2016 (CN) .......................... 2016 1 0231449

(51) Int. Cl.
*H01L 21/28* (2006.01)
*H01L 29/66* (2006.01)
(Continued)

(52) U.S. Cl.
CPC .... *H01L 21/28123* (2013.01); *H01L 21/0214* (2013.01); *H01L 21/0217* (2013.01); *H01L 21/0228* (2013.01); *H01L 21/02164* (2013.01); *H01L 21/02167* (2013.01); *H01L 21/02274* (2013.01); *H01L 21/28088* (2013.01);
(Continued)

(58) Field of Classification Search
CPC .......... H01L 21/0214; H01L 21/02164; H01L 21/02167; H01L 21/0217; H01L 21/0228; H01L 27/28088; H01L 27/28123; H01L 27/092; H01L 27/0924; H01L 29/66545; H01L 29/66553; H01L 29/66795; H01L 29/785
See application file for complete search history.

(56) References Cited

U.S. PATENT DOCUMENTS 8,507,979 B1 8/2013 Huang et al.
9,455,227 B1 * 9/2016 Hung ................ H01L 29/66545
(Continued)

OTHER PUBLICATIONS

The European Patent Office (EPO) The Extended European Search Report for 17164961.9 dated Aug. 30, 2017 7 Pages.

*Primary Examiner* — Joseph M Galvin, III
(74) *Attorney, Agent, or Firm* — Anova Law Group, PLLC

(57) ABSTRACT

A transistor and a method of forming the transistor are provided. The method includes forming a first interlayer dielectric layer on a substrate, forming an opening through the first interlayer dielectric layer, and forming a work function layer over side surfaces and a bottom of the opening. The method further includes forming a gate electrode layer over the work function layer, removing at least a portion of the work function layer over side surfaces of the gate electrode layer to form grooves, and forming a protection layer in the grooves.

13 Claims, 7 Drawing Sheets

(51) Int. Cl.
  *H01L 21/8238* (2006.01)
  *H01L 29/423* (2006.01)
  *H01L 29/78* (2006.01)
  *H01L 27/092* (2006.01)
  *H01L 21/02* (2006.01)
  *H01L 21/768* (2006.01)
  *H01L 29/49* (2006.01)

(52) U.S. Cl.
  CPC .. *H01L 21/76805* (2013.01); *H01L 21/76895* (2013.01); *H01L 21/823821* (2013.01); *H01L 21/823842* (2013.01); *H01L 27/092* (2013.01); *H01L 27/0924* (2013.01); *H01L 29/42372* (2013.01); *H01L 29/4966* (2013.01); *H01L 29/4983* (2013.01); *H01L 29/66545* (2013.01); *H01L 29/66553* (2013.01); *H01L 29/66795* (2013.01); *H01L 29/785* (2013.01)

(56) References Cited

U.S. PATENT DOCUMENTS

| | | | |
|---|---|---|---|
| 9,496,361 B1* | 11/2016 | Tung | H01L 29/4958 |
| 9,570,319 B2* | 2/2017 | Lin | H01L 29/66795 |
| 9,865,697 B1* | 1/2018 | Hsueh | H01L 29/4966 |
| 2013/0175619 A1 | 7/2013 | Fan et al. | |
| 2014/0070327 A1 | 3/2014 | Niimi et al. | |
| 2014/0203333 A1* | 7/2014 | Huang | H01L 29/4966 257/288 |
| 2016/0049495 A1* | 2/2016 | Trevino | H01L 29/66545 257/410 |
| 2016/0336426 A1* | 11/2016 | Chang | H01L 29/66545 |
| 2016/0365449 A1* | 12/2016 | Chang | H01L 29/4232 |
| 2017/0103896 A1* | 4/2017 | Hung | H01L 29/66545 |
| 2017/0222005 A1* | 8/2017 | Lin | H01L 21/28079 |

* cited by examiner

TRANSISTOR AND FABRICATION METHOD THEREOF

CROSS-REFERENCES TO RELATED APPLICATIONS

This application claims the priority of Chinese patent application No. 201610231449.8, filed on Apr. 14, 2016, the entirety of which is incorporated herein by reference.

FIELD OF THE DISCLOSURE

The present disclosure generally relates to the field of semiconductor manufacturing technology and, more particularly, relates to a transistor and fabrication method thereof.

BACKGROUND

Metal-oxide-semiconductor (MOS) transistors are an important type of transistors. A basic structure of the MOS transistors includes a semiconductor substrate, a gate structure disposed on surface of the semiconductor substrate, and source/drain regions located on two sides of the gate structure in the semiconductor substrate. The gate structure includes a gate dielectric layer disposed on the semiconductor substrate and a gate electrode layer disposed on surface of the gate dielectric layer.

A process of fabricating the MOS transistors includes providing a semiconductor substrate, forming a gate structure on surface of the semiconductor substrate, and forming source/drain regions on two sides of the gate structure in the semiconductor substrate.

A back-end process further includes forming an interlayer dielectric layer covering the gate structure and the semiconductor substrate, forming openings (also called through-holes) penetrating the interlayer dielectric layer and exposing a surface of the source/drain regions, and forming conductive plugs in the openings.

As the critical dimension further reduces, the distance between adjacent gate structures decreases, and correspondingly, the distance between the conductive plugs on the source/drain regions and the gate structure decreases. Accordingly, in an MOS transistor, isolation performance between the gate electrode layer and the conductive plugs deteriorates, resulting in deterioration of the electrical properties of the transistor.

The disclosed transistor and fabrication method thereof are directed to at least partially solving one or more problems set forth above and other problems.

BRIEF SUMMARY OF THE DISCLOSURE

One aspect of the present disclosure provides a method of forming a transistor. The method includes forming a first interlayer dielectric layer on a substrate, forming an opening through the first interlayer dielectric layer, and forming a work function layer over side surfaces and a bottom of the opening. The method further includes forming a gate electrode layer over the work function layer, removing at least a portion of the work function layer over side surfaces of the gate electrode layer to form grooves, and forming a protection layer in the grooves.

Another aspect of the present disclosure provides a transistor. The transistor includes a substrate, a first interlayer dielectric layer disposed on the substrate, a work function layer, a gate electrode layer, and a protection layer. The first interlayer dielectric layer includes an opening there-through. The work function layer is at least disposed over a bottom of the opening. The gate electrode layer is disposed in the opening and over the work function layer. The protection layer is disposed on a top surface of the work function layer and between the gate electrode layer and the first interlayer dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

According to the present disclosure, an opening is formed penetrating a first interlayer dielectric layer on a substrate, a work function layer is formed on side surfaces and a bottom of the opening, and a gate electrode layer is formed over the work function layer. At least a portion of the work function layer on side surfaces of the gate electrode layer is removed to form grooves. A protection layer is formed in the grooves, and the protection layer replaces the work function layer on two side surfaces of the gate electrode layer.

Because the electrical conductivity of the protection layer is lower than the electrical conductivity of the work function layer, the insulating performance of the protection layer is better than the insulating performance of the work function layer. Accordingly, the isolation performance of the transistor is enhanced, and the electrical properties of the transistor are improved.

Figure 1:
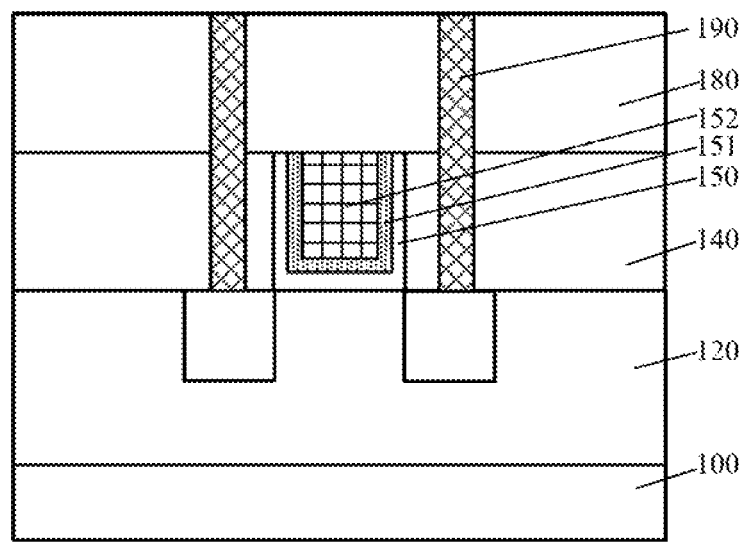
FIG. 1 illustrates an intermediate structure corresponding to a certain stage of an exemplary fabrication process of a transistor consistent with the disclosed embodiments.

In one embodiment, FIG. 1 illustrates an intermediate structure corresponding to a certain stage of an exemplary fabrication process of a transistor consistent with the disclosed embodiments. As shown in FIG. 1, the transistor may include a substrate including a semiconductor substrate 100 and a fin 120 on surface of the semiconductor substrate 100. The transistor may further include a first interlayer dielectric layer 140 disposed on the substrate, an opening (not shown) penetrating the first interlayer dielectric layer 140, a gate dielectric layer 150, a work function layer 151, a gate electrode layer 152, a second interlayer dielectric layer 180, and conductive plugs 190.

In particular, the opening may expose a part of top surface and side surfaces of the fin 120. The gate dielectric layer 150 may be disposed on side surfaces and a bottom of the opening. Optionally, the gate dielectric layer 150 may only be disposed on the bottom of the opening. The work function layer 151 may be disposed on the gate dielectric layer 150. The gate electrode layer 152 may be disposed on the work function layer 151. The second interlayer dielectric layer 180 may be disposed on the first interlayer dielectric layer 140, the gate dielectric layer 150, the work function layer 151, and the gate electrode layer 152. The conductive plugs 190 may penetrate the first interlayer dielectric layer 140 and the second interlayer dielectric layer 180, and be disposed on two sides of the gate dielectric layer 150, the work function layer 151, and the gate electrode layer 152. Materials sandwiched between the conductive plugs 190 and the gate electrode layer 152 may include a material of the first interlayer dielectric layer 140, optionally a material of the gate dielectric layer 150, and a material of the work function layer 151.

As the critical dimension (e.g., transistor gate length) further reduces, a distance between adjacent gate electrode layers 152 may be significantly decreased, and correspondingly, a distance between the conductive plug 190 and the gate electrode layer 152 may be significantly decreased. Further, because a voltage applied between the conductive plug 190 and the gate electrode layer 152 remains basically unchanged, an electric field between the gate electrode layer 152 and the conductive plug 190 may be enhanced, resulting in an easy breakdown between the gate electrode layer 152 and the conductive plug 190. Accordingly, isolation performance between the conductive plug 190 and the gate electrode layer 152 may be deteriorated, rendering deteriorated electrical properties of the transistor.

The present disclosure provides a transistor and method of fabricating the transistor. An exemplary method may include providing a substrate. A first interlayer dielectric layer may be disposed on surface of the substrate, and an opening may be formed to penetrate the first interlayer dielectric layer disposed on the surface of the substrate. The method may further include forming a work function layer on side surfaces and a bottom of the opening and forming a gate electrode layer on the work function layer to substantially fill the opening.

Further, the method may include removing a portion of the work function layer on two side surfaces of the gate electrode layer to form grooves, and forming a protection layer in the grooves. The method may use the protection layer to replace the work function layer on the two side surfaces of the gate electrode layer, thus improving the electrical properties of the transistors.

The above-described goals, features, and advantages of the present disclosure will become more apparent and be better understood by reference to the following specific embodiments of the present disclosure taken in conjunction with the accompanying drawings.

In particular, the transistor may be a planar MOS transistor, or a fin field-effect transistor (FinFET). Hereinafter, an FinFET is described for purpose of illustration.

Figure 2:
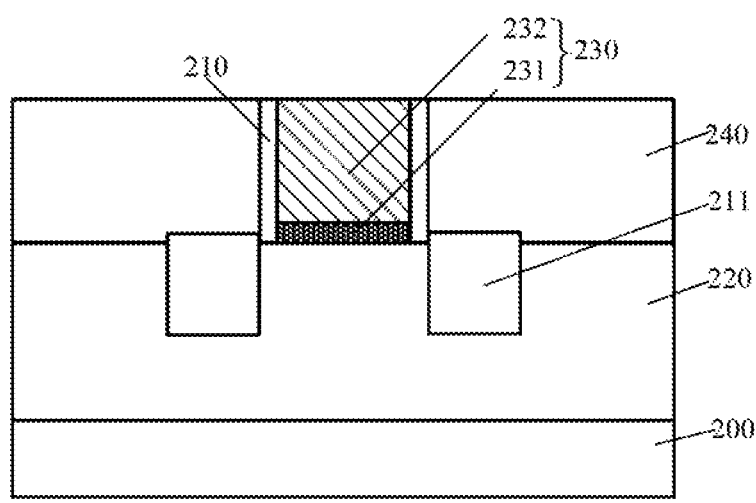
FIGS. 2~8 illustrate intermediate structures corresponding to certain stages of an exemplary fabrication process of a transistor consistent with the disclosed embodiments.
Figure 14:
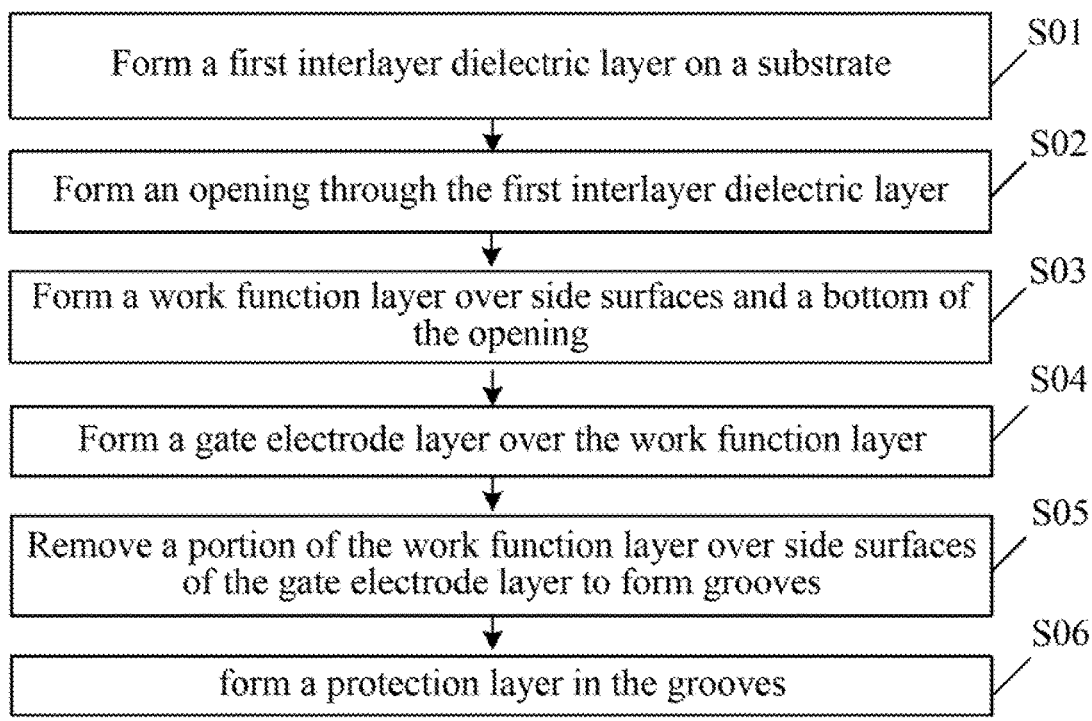
FIG. 14 illustrates a flow chart of an exemplary fabrication process of a transistor consistent with the disclosed embodiments.

FIGS. 2~8 illustrate intermediate structures corresponding to certain stages of an exemplary fabrication process of a transistor consistent with the disclosed embodiments. FIG. 14 illustrates a flow chart of an exemplary fabrication process of a transistor consistent with the disclosed embodiments. Referring to FIG. 2, FIG. 2 provides a substrate and a dummy gate structure 230 formed on surface of the substrate.

In one embodiment, as shown in FIG. 2, the substrate may include a semiconductor substrate 200 and a fin 220 on surface of the semiconductor substrate 200. In other embodiments, the transistor may be a planar MOS transistor, and the substrate may be a semiconductor substrate.

Optionally, the semiconductor substrate 200 may be made of a semiconductor material such as silicon, germanium, silicon germanium, or gallium arsenide, etc. More specifically, the semiconductor substrate 200 may, for example, be made of monocrystalline silicon, polycrystalline silicon, or amorphous silicon. In the present disclosure, silicon may be used as an exemplary material of the semiconductor substrate 200 for illustrative purpose.

An isolation structure may also be formed on the surface of the semiconductor substrate 200, and a top surface of the isolation structure may be lower than a top surface of the fin 220. The isolation structure may be configured to electrically isolate the fin 220, and a material of the isolation structure may include silicon oxide or silicon oxynitride.

The dummy gate structure 230 may stretch over the fin 220 and cover a part of the top surface and side surfaces of the fin 220. The dummy gate structure 230 may include a dummy gate dielectric layer 231 that stretches over the fin 220 and a dummy gate electrode layer 232 disposed on surface of the dummy gate dielectric layer 231. In particular, the dummy gate dielectric layer 231 may be disposed on the surface of the isolation structure and cover a part of the top surface and side surfaces of the fin 220. Optionally, a material of the dummy gate electrode layer 232 may be polycrystalline silicon.

If the dummy gate electrode layer 232 is removed in a subsequent step to form a groove, then after forming the groove, the dummy gate dielectric layer 231 may become a gate dielectric layer. Thus, a material of the dummy gate dielectric layer 231 may be a high-K dielectric material (K>3.9). If the dummy gate electrode layer 232 and the dummy gate dielectric layer 231 are removed in the subsequent step to form the groove, after forming the groove, a gate dielectric layer may be formed on side surfaces and a bottom of the groove. In one embodiment, a material of the dummy gate dielectric layer 231 may be silicon oxide. In this case, the dummy gate electrode layer 232 and the dummy gate dielectric layer 231 may be removed in a subsequent step to form the groove for illustrative purpose.

Further, referring to FIG. 2, source/drain regions 211 may be formed on two sides of the dummy gate structure 230 in the fin 220. After forming the source/drain regions 211, a first interlayer dielectric layer 240 may be formed on the substrate that covers side surfaces of the dummy gate structure 230 (Step 01 in FIG. 14).

In one embodiment, before forming the source/drain regions 211, sidewall spacers 210 may be formed on two side surfaces of the dummy gate structure 230. The source/drain regions 211 may be formed on two sides of the dummy gate structure 230 and the sidewall spacers 210 in the fin 220. The first interlayer dielectric layer 240 may be formed on the substrate covering the side surfaces of the sidewall spacers 210. In other embodiments, sidewall spacers 210 may not be formed.

When the type of the transistor is N-type, a material of the source/drain regions 211 may be N-type doped silicon carbide, and when the type of the transistor is P-type, the material of the source/drain regions 211 may be P-type doped silicon germanium. Further, a material of the first interlayer dielectric layer 240 may include silicon oxide or carbon-doped silicon oxide.

Figure 3:
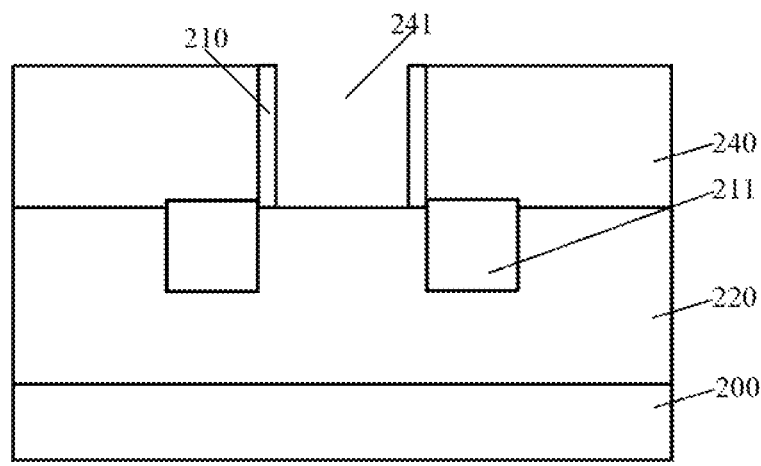

Referring to FIG. 3, after forming the first interlayer dielectric layer 240, the dummy gate structure 230 (as shown in FIG. 2) may be removed, thus forming an opening 241 (Step 02 in FIG. 14). In particular, the dummy gate structure 230 may be removed using a dry etching process, a wet etching process, or a process combining the dry etching process and the wet etching process. The opening 241 may penetrate the first interlayer dielectric layer 240. In one embodiment, the opening 241 may expose a part of the top surface and side surfaces of the fin 220, as well as a part of the surface of the isolation structure.

Further, referring to FIG. 3, in the opening 241, a gate dielectric layer may be formed on side surfaces and a bottom of the opening 241, a work function layer may be disposed on the gate dielectric layer that is on the side surfaces and the bottom of the opening 241 (Step 03 in FIG. 14), a barrier layer may be disposed on the work function layer, and a gate electrode layer may be disposed on the barrier layer that is on the work function layer (Step 04 in FIG. 14).

Figure 4:
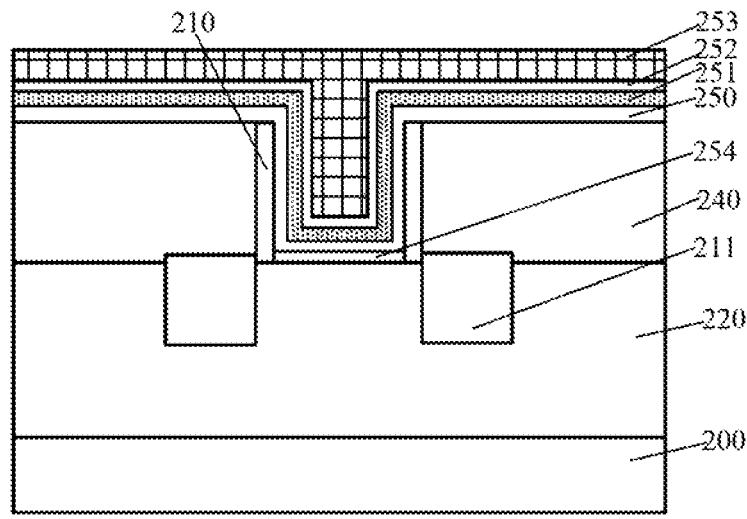
Figure 5:
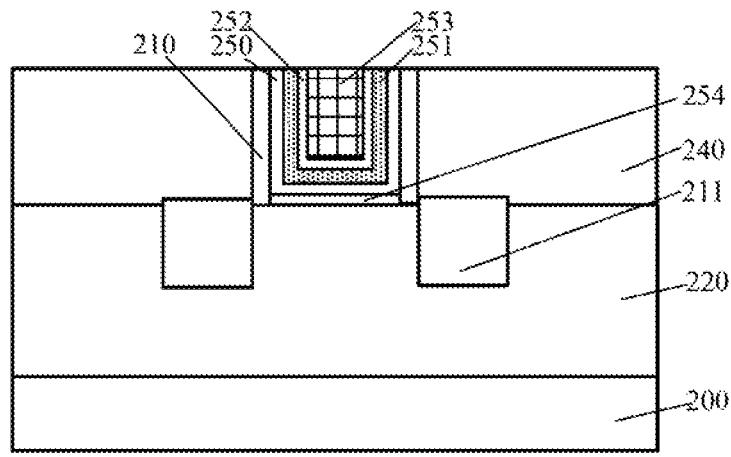

Referring to FIG. 4, before forming the gate dielectric layer, the work function layer, the barrier layer, and/or the gate electrode layer, an interface layer 254 may be formed on the bottom of the opening 241. A material of the interface layer 254 may be silicon oxide, and a process to form the interface layer 254 may be an oxidation process.

A method of forming the gate dielectric layer, the work function layer, the barrier layer, and/or the gate electrode layer may include, referring to FIG. 4, forming a gate dielectric layer 250 on the bottom and side surfaces of the opening 241, on top surface of the sidewall spacers 210, and on top surface of the first interlayer dielectric layer 240. The method may further include forming a work function layer 251 covering the gate dielectric layer 250, forming a barrier layer 252 covering the work function layer 251, and forming a gate electrode layer 253 covering the barrier layer 252. Then, referring to FIG. 5, a part of the gate dielectric layer 250, a part of the work function layer 251, a part of the barrier layer 252, and a part of the gate electrode layer 253 that are above the top surface of the first interlayer dielectric layer 240 may be removed.

In particular, a material of the gate dielectric layer 250 may be a high-K dielectric material (K>3.9), such as $HfO_2$, $La_2O_3$, HfSiON, $HfAlO_2$, $ZrO_2$, $Al_2O_3$, $La_2O_3$, and $HfSiO_4$. A process of forming the gate dielectric layer 250 may be atomic layer deposition, plasma chemical vapor deposition, metal-organic chemical vapor deposition, or plasma assisted atomic layer deposition, etc.

The work function layer 251 may be configured to adjust the work function of the transistor, reduce the threshold voltage of the transistor, and decrease power consumption. A material of the work function layer 251 may be Ti, Ta, TiN, TaN, TiAl, TaSiN, TiSiN, TiAlN, or TaAlN. The work function layer 251 may also be formed by atomic layer deposition, plasma chemical vapor deposition, metal-organic chemical vapor deposition, or plasma assisted atomic layer deposition, etc.

In one embodiment, when the transistor is an N-type FinFET, a material of the work function layer 251 may be TiAl, and when the transistor is a P-type FinFET, the material of the work function layer 251 may be TiN.

A material of the barrier layer 252 may include TiN, TaC, TaN, HfN, or ZrN. A process that forms the barrier layer 252 may be a deposition process, such as atomic layer deposition, plasma chemical vapor deposition, metal-organic chemical vapor deposition, or plasma assisted atomic layer deposition, etc. For example, in one embodiment, the material of the barrier layer 252 may be TiN, and the barrier layer 252 may prevent atoms in the gate electrode layer 253 from diffusing towards the first interlayer dielectric layer 240 and the gate dielectric layer 250.

A material of the gate electrode layer 253 may be Al, Cu, Ag, Au, Ni, Ti, W, WN, or WSi. A process to form the gate electrode layer 253 may be a deposition process, such as a physical vapor deposition process or a chemical vapor deposition process.

Further, a process to remove a part of the gate dielectric layer 250, a part of the work function layer 251, a part of the barrier layer 252, and a part of the gate electrode layer 253 that are above the top surface of the first interlayer dielectric layer 240 may be a chemical mechanical planarization (CMP) process, or a back-etching process.

Figure 6A:
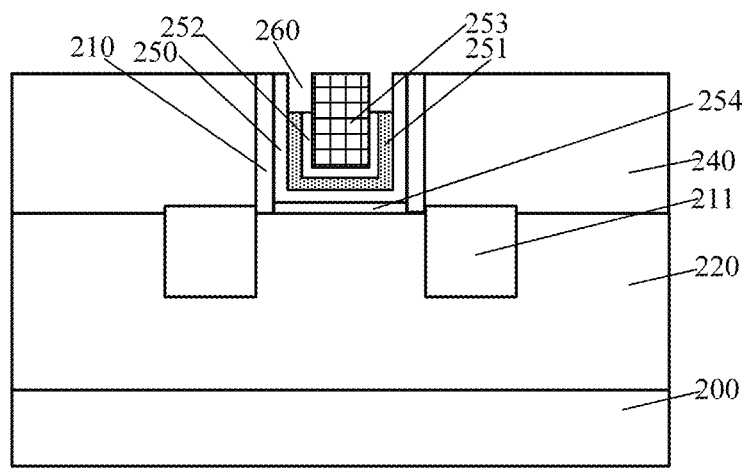
Figure 6B:
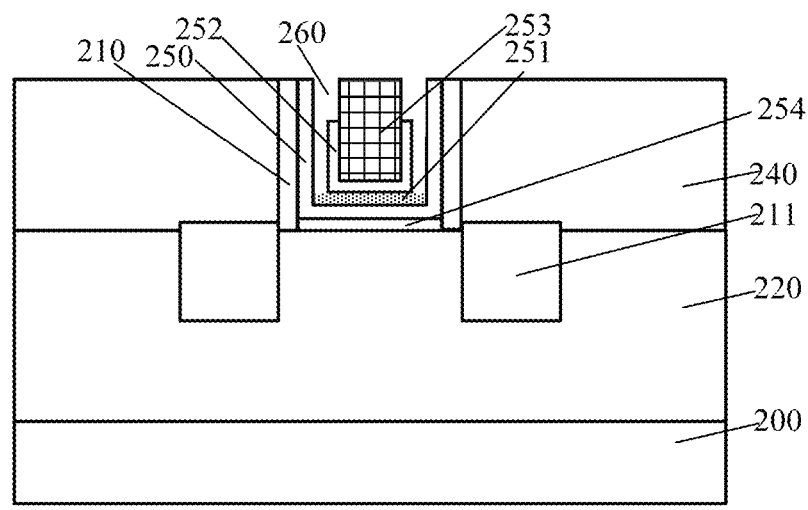

Referring to FIG. 6a, a part of the work function layer 251 and a part of the optional barrier layer 252 on two side surfaces of the gate electrode layer 253 may be removed to form grooves 260 (Step 05 in FIG. 14). In some embodiments, a part of the work function layer 251 and a part of the barrier layer 252 on the two side surfaces of the gate electrode layer 253 may be removed to from the grooves 260 as illustrated herein. In other embodiments, the whole work function layer 251 and the whole barrier layer 252 on the two side surfaces of the gate electrode layer 253 may be removed to from the grooves 260. As shown in FIG. 6b, the whole work function layer 251 on the two side surfaces of the gate electrode layer 253 is complete removed. A process to remove the work function layer 251 and the barrier layer 252 on the two side surfaces of the gate electrode layer 253 may include an anisotropic dry etching process, or a wet etching process.

In some other embodiments, the optional barrier layer may not be formed. In this case, only the work function layer on the two side surfaces of the gate electrode layer may be removed to form the grooves (Step 05 in FIG. 14). In one embodiment, when no barrier layer is formed, a part of the work function layer on the two side surfaces of the gate electrode layer may be removed to form the grooves. In another embodiment, the whole function layer on the two side surfaces of the gate electrode layer may be removed to form the grooves.

Figure 7A:
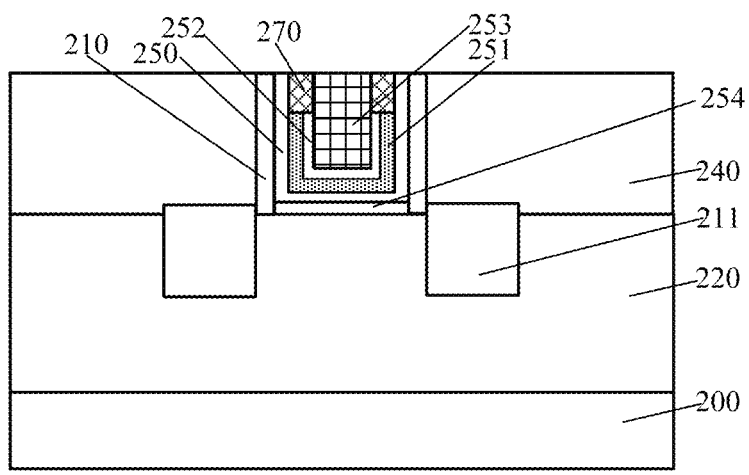

Referring to FIG. 7a, a protection layer 270 may be formed in the grooves 260 illustrated in FIG. 6a (Step 06 in FIG. 14). The electrical conductivity of the protection layer 270 may be smaller than the electrical conductivity of the work function layer 251. A material of the protection layer 270 may be silicon nitride, silicon oxide, silicon oxynitride, or silicon carbide.

Further, a method of forming the protection layer 270 may include using a deposition process to form the protection layer 270 in the grooves 260, on top surface of the first interlayer dielectric layer 240, on top surface of the sidewall spacers 210, and on top surface of the gate electrode layer 253. The method may further include using a back-etching process or a chemical mechanical planarization process to remove a part of the protection layer 270 that is above the top surface of the first interlayer dielectric layer 240, thus forming the protection layer 270 in the grooves 260. In particular, the deposition process may, for example, be a plasma enhanced chemical vapor deposition process, a plasma enhanced atomic layer deposition process, or a high-density plasma chemical vapor deposition process.

In one embodiment, the process to form the protection layer 270 may specifically be a plasma enhanced chemical vapor deposition process. When the material of the protection layer 270 is silicon oxide, the plasma enhanced chemical vapor deposition process adopted to form the protection layer 270 may use tetraethoxysilane (TEOS) and $O_2$ as reaction precursors. Parameters of the deposition process may include: a flow rate of TEOS at about 4 g/min~8 g/min, a flow rate of $O_2$ at about 3500 sccm~5000 sccm, a radio-frequency power of about 800 W~1500 W, a chamber pressure of about 5 torr~10 torr, and a temperature at about 350° C.~410° C.

Optionally, when the material of the protection layer 270 is silicon nitride, the plasma enhanced chemical vapor deposition process adopted to form the protection layer 270 may use $SiH_2Cl_2$, $NH_3$, and $N_2$ as the gas. Further, parameters of the deposition process may include: a flow rate of $SiH_2C_2$ at about 800 sccm~1000 sccm, a flow rate of $NH_3$ at about 1200 sccm~1500 sccm, a flow rate of $N_2$ at about 500 sccm~1000 sccm, the radio-frequency power of about 800 W~1000 W, the chamber pressure of about 5 torr~10 torr, and the temperature at about 330° C.~370° C. When the material of the protection layer 270 is silicon oxynitride or silicon carbide, the parameters adopted to form the protection layer 270 may not be described in detail here.

In one embodiment, the protection layer 270 may be disposed on two side surfaces of the gate electrode layer 253, on top surface of the work function layer 251 and on top surface of the barrier layer 252. In other embodiments, when no barrier layer 252 is formed, the protection layer 270 may be disposed on two side surfaces of the gate electrode layer 253 and on top surface of the work function layer 251.

Figure 7B:
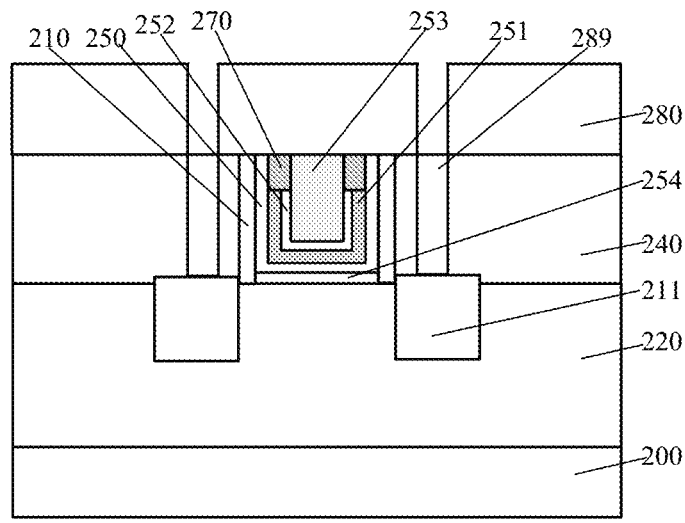
Figure 8:
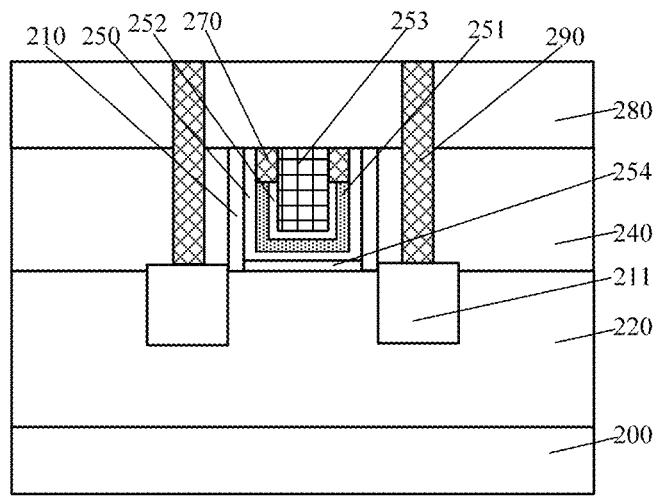

Referring to FIG. 8, a second interlayer dielectric layer 280 may be formed that covers the sidewall spacers 210, the first interlayer dielectric layer 240, the gate dielectric layer 250, the protection layer 270 and the gate electrode layer 253. Through-holes 289, as shown in FIG. 7b, may be formed penetrating the second interlayer dielectric layer 280 and the first interlayer dielectric layer 240. Further, the through-holes may expose the substrate surface on two sides of the gate dielectric layer 250, the work function layer 251, the barrier layer 252, the protection layer 270 and the gate electrode layer 253.

In particular, the through-holes may expose the surface of the source/drain regions 211, and the conductive plugs 290 may be formed in the through-holes. Optionally, before forming the conductive plugs 290, a metal silicide layer may be formed on the bottom of the through-holes, thus reducing the contact resistance between the source/drain regions 211 and the conductive plugs 290.

Further, a material of the second interlayer dielectric layer 280 may be silicon oxide or carbon-doped silicon oxide. In one embodiment, the material of the second interlayer dielectric layer 280 may be silicon oxide. A process to form the second interlayer dielectric layer 280 may be a deposition process, such as a plasma enhanced chemical vapor deposition process, a plasma enhanced atomic layer deposition, a high-density plasma chemical vapor deposition process. Further, if the material of the second interlayer dielectric layer 280 is the same as the protection layer 270, the second interlayer dielectric layer 280 and the protection layer 270 may be formed simultaneously using the same step, thus simplifying the process.

Because the protection layer is formed in the grooves and replaces the work function layer at least on two side surfaces of the gate electrode layer, the first interlayer dielectric layer and the protection layer may be sandwiched between the gate electrode layer and the conductive plugs. Because the electrical conductivity of the protection layer is lower than the electrical conductivity of the work function layer, the insulating performance of the protection layer may be better than the insulating performance of the work function layer. Accordingly, the insulating performance of the material between the gate electrode layer and the conductive plugs may be improved, thus better isolating the gate electrode layer and the conductive plugs. That is, the isolation performance between the gate electrode layer and the conductive plugs is enhanced, thus improving the electrical properties of the transistor.

Further, in one embodiment, only a part (e.g., a thickness portion or an upper portion) of the work function layer on two side surfaces of the gate electrode layer may be removed, and the work function layer on the bottom portion of the gate electrode layer may remain unchanged. Because the work function layer on the bottom of the gate electrode layer is a part of the work function layer that affects the threshold voltage of the transistor, when the work function layer on the bottom of the gate electrode layer remains unchanged, the threshold voltage of the transistor may not be affected.

The present disclosure also provides a transistor fabricated using the above method. Further, referring to FIG. 8, the transistor may include a substrate, a first interlayer dielectric layer 240 disposed on surface of the substrate, an opening 241 (illustrated in FIG. 3), a work function layer 251, a barrier layer 252, gate electrode layer 253, and a protection layer 270. In particular, the substrate may include a semiconductor substrate 200 and a fin 220 disposed on surface of the semiconductor substrate 200.

Further, the opening 241 may penetrate the first interlayer dielectric layer 240, and expose a part of the top surface and side surfaces of the fin 220. The work function layer 251 may be disposed on the bottom and a part of the side surfaces of the opening 241. The gate electrode layer 253 may be disposed in the opening 241 and on the work function layer 251. The barrier layer 252 may be disposed between the work function layer 251 and the gate electrode layer 253. The protection layer 270 may be disposed on two side surfaces of the gate electrode layer 253, on top surface of the work function layer 251, and on top surface of the barrier layer 252.

Particularly, the top surface of the work function layer 251 may be higher than, level with, or lower than the top surface of the barrier layer 252 based on the top surface of the substrate. That is, the work function layer 251 and the barrier layer 252 may have the same or a different height based on the top surface of the substrate.

For example, the material of the protection layer 270 may be silicon nitride, silicon oxide, silicon oxynitride, or silicon carbide. The electrical conductivity of the protection layer 270 may be smaller than the electrical conductivity of the work function layer 251. The protection layer 270 may be disposed on a part of side surfaces of the gate electrode layer 253 or disposed on the whole side surfaces of the gate electrode layer 253.

In one embodiment, between the work function layer 251 and the substrate, and between the work function layer 251 and the first interlayer dielectric layer 240, a gate dielectric layer 250 may be disposed. In other embodiments, the gate dielectric layer 250 may be disposed between the work function layer 251 and the substrate. Further, in one embodiment, an interface layer 254 may be disposed between the gate dielectric layer 250 and the substrate. In other embodiments, no interface layer may be disposed.

The transistor may also include sidewall spacers 210, source/drain regions 211, a second interlayer dielectric layer 280, and conductive plugs 290. The sidewall spacers 210 may be disposed between the first interlayer dielectric layer 240 and the work function layer 251. Specifically, the sidewall spacers 210 may be disposed between the first interlayer dielectric layer 240 and the gate dielectric layer 250. The source/drain regions 211 may be disposed on two sides of the gate dielectric layer 250, the work function layer 251, the protection layer 270, the barrier layer 252, the gate electrode layer 253 and the sidewall spacers 210 in the fin 220.

Further, the second interlayer dielectric layer 280 may cover the first interlayer dielectric layer 240, the sidewall spacers 210, the gate dielectric layer 250, the protection layer 270, and the gate electrode layer 253. The conductive plugs 290 may penetrate the first interlayer dielectric layer 240 and the second interlayer dielectric layer 280 and be disposed on the source/drain regions 211.

In the disclosed transistor, a protection layer may be disposed on side surfaces of the gate electrode layer, and the protection layer may also cover the top surface of the work function layer. Because the electrical conductivity of the protection layer is lower than the electrical conductivity of the work function layer, the insulating performance of the protection layer may be better than the insulating performance of the work function layer. Accordingly, the insulating performance of the material between the gate electrode layer and the conductive plugs may be improved, thus improving the electrical properties of the transistor.

Another embodiment of the present disclosure provides a method of fabricating transistors. For example, the method may include providing a substrate, and the substrate may include a first region and a second region. A first interlayer dielectric layer and openings penetrating the first interlayer dielectric layer may be disposed on surface of the substrate. The openings may include a first opening disposed on the first region and a second opening disposed on the second region.

In the first opening, a first work function layer may be disposed on side surfaces and a bottom of the first opening, and a first gate electrode layer may be disposed on the first work function layer. In the second opening, a second work function layer may be disposed on side surfaces and a bottom of the second opening, and a second gate electrode layer may be disposed on the second work function layer. The first work function layer on two side surfaces of the first gate electrode layer may be removed to form first grooves. The second work function layer on two side surfaces of the second gate electrode layer may be removed to form second grooves. A first protection layer may be formed in the first grooves, and a second protection layer may be formed in the second grooves.

Figure 9:
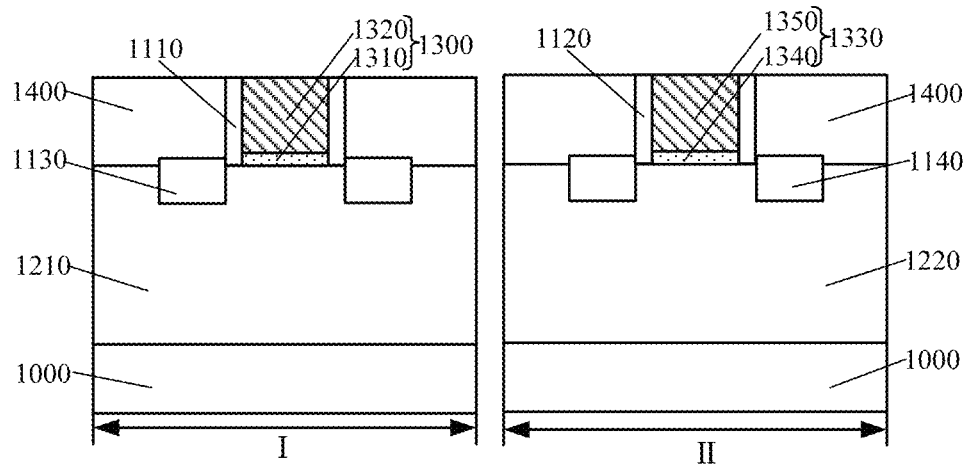
FIGS. 9~13 illustrate intermediate structures corresponding to certain stages of another exemplary fabrication process of a transistor consistent with the disclosed embodiments.

FIGS. 9~13 illustrate intermediate structures corresponding to certain stages of another exemplary fabrication process of a transistor consistent with the disclosed embodiments. Referring to FIG. 9, FIG. 9 provides a substrate. The substrate may include a first region (region I) and a second region (region II). Dummy gate structures may be disposed on surface of the substrate, and the dummy gate structures may include a first dummy gate structure 1300 disposed on surface of the first region of the substrate and a second dummy gate structure 1330 disposed on surface of the second region of the substrate.

The first region may be configured to form a first FinFET, and the second region may be configured to form a second FinFET. The type of the first FinFET and the type of the second FinFET may be different or the same. In one embodiment, the first FinFET may be N-type, and the second FinFET may be P-type for illustrative purpose.

The substrate may include a semiconductor substrate 1000, and a fin on surface of the semiconductor substrate 1000. In other embodiments, the transistor may be a planar MOS transistor, and the substrate may be a semiconductor substrate. Further, the fin may include a first fin 1210 disposed in the first region and a second fin 1220 disposed in the second region.

An isolation structure may also be formed on surface of the semiconductor substrate 1000, and a top surface of the isolation structure may be lower than top surface of the first fin 1210 and top surface of the second fin 1220. The isolation structure may be configured to electrically isolate the first fin 1210 and the second fin 1220. Further, a material of the isolation structure may include silicon oxide or silicon oxynitride.

Further, the dummy gate structures may stretch over the fins and cover a part of the top surface and side surfaces of the fins. Specifically, the first dummy gate structure 1300 may stretch over the first fin 1210 and cover a part of the top surface and side surfaces of the first fin 1210. The second dummy gate structure 1330 may stretch over the second fin 1220 and cover a part of the top surface and side surfaces of the second fin 1220.

The first dummy gate structure 1300 may include a first dummy gate dielectric layer 1310 stretching over the first fin 1210, and a first dummy gate electrode layer 1320 disposed on surface of the first dummy gate dielectric layer 1310. The second dummy gate structure 1330 may include a second dummy gate dielectric layer 1340 stretching over the second fin 1220, and a second dummy gate electrode layer 1350 disposed on surface of the second dummy gate dielectric layer 1340.

For example, the first dummy gate dielectric layer 1310 may be disposed on surface of the isolation structure in the first region, and cover a part of the top surface and side surfaces of the first fin 1210. The second dummy gate dielectric layer 1340 may be disposed on surface of the isolation structure in the second region, and cover a part of the top surface and side surfaces of the second fin 1220. A material of the first dummy gate electrode layer 1320 and the second dummy gate electrode layer 1350 may be polycrystalline silicon.

If in a subsequent step, the first dummy gate dielectric layer 1310 is removed to form first grooves and the second dummy gate dielectric layer 1340 is removed to form second grooves, then after forming the first grooves and the second grooves, the first dummy gate dielectric layer 1310 may become a first gate dielectric layer, and the second dummy gate dielectric layer 1340 may become a second dielectric layer. Thus, a material of the first dummy gate dielectric layer 1310 and a material of the second dummy gate dielectric layer 1340 may be a high-K dielectric material (K>3.9).

If in the subsequent step, the first dummy gate dielectric layer 1310 and the first dummy gate electrode layer 1320 are removed to form the first grooves, and the second dummy gate dielectric layer 1340 and the second dummy gate electrode layer 1350 are removed to form the second grooves, after forming the first grooves and the second grooves, a first gate dielectric layer may be formed on side surfaces and a bottom of the first grooves, and a second gate dielectric layer may be formed on side surfaces and a bottom of the second grooves. In one embodiment, a material of the first dummy gate dielectric layer 1310 and a material of the second dummy gate dielectric layer 1340 may be silicon oxide.

The first dummy gate dielectric layer 1310 and the second dummy gate electrode layer 1320 may be removed to form the first grooves for illustrative purpose, and the second dummy gate dielectric layer 1340 and the second dummy gate electrode layer 1350 may be removed to form the second grooves for illustrative purpose.

Further, referring to FIG. 9, first source/drain regions 1130 may be formed in the first fin 1210 on two sides of the first dummy gate structure 1300. Second source/drain regions 1140 may be formed in the second fin 1220 on two sides of the second dummy gate structure 1330. After forming the first source/drain regions 1130 and the second source/drain regions 1140, a first interlayer dielectric layer 1400 may be formed on substrate that covers side surfaces of the first dummy gate structure 1300 and side surfaces of the second dummy gate structure 1330.

In one embodiment, before forming the first source/drain regions 1130 and the second source/drain regions 1140, first sidewall spacers 1110 may be formed on two side surfaces of the first dummy gate structure 1300, and second sidewall spacers 1120 may be formed on two side surfaces of the second dummy gate structure 1330. Then, the first source/drain regions 1130 may be formed on two sides of the first dummy gate structure 1300 and the first sidewall spacers 1110 in the first fin 1210. The second source/drain regions 1140 may be formed on two sides of the second dummy gate structure 1330 and the second sidewall spacers 1120 in the second fin 1220. Later, the first interlayer dielectric layer 1400 may be formed on the substrate covering the side surfaces of the first sidewall spacers 110 and surface surfaces of the second sidewall spacers 1120. In other embodiments, the first sidewall spacers and the second sidewall spacers may not be formed.

Because the transistor formed in the first region is N-type, a material of the first source/drain regions 1130 may be N-type doped silicon carbide. Because the transistor formed in the second region is P-type, a material of the second source/drain regions 1140 may be P-type doped silicon germanium. Further, a material of the first interlayer dielectric layer 1400 may include silicon oxide or carbon-doped silicon oxide.

Figure 10:
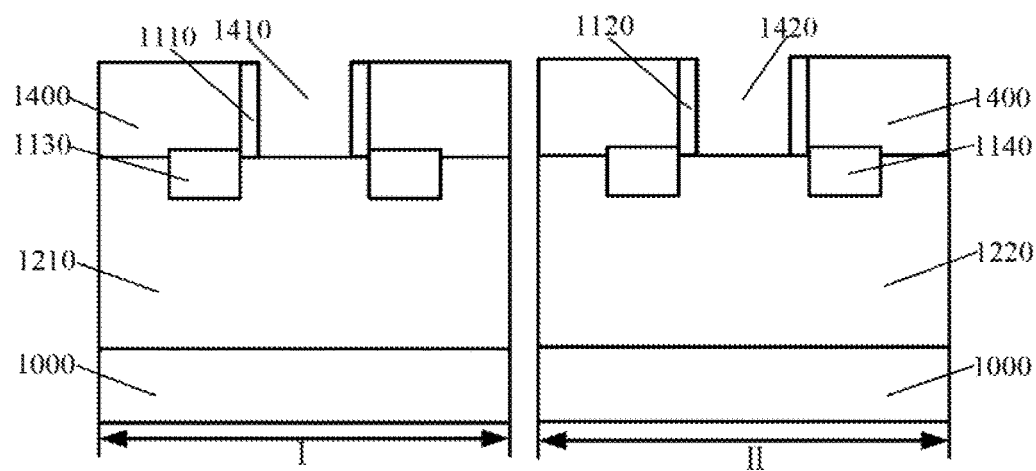

Referring to FIG. 10, the dummy gate structures (illustrated in FIG. 9) may be removed to form openings. Specifically, the first dummy gate structure 1300 may be removed to form a first opening 1410, and the second dummy gate structure 1330 may be removed to form a second opening 1420. That is, the openings may include the first opening 1410 and the second opening 1420.

The process to remove the first dummy gate structure 1300 and the second dummy gate structure 1330 may refer to the process that removes the dummy gate structure 230, and is not repeated here.

Further, the first opening 1410 and the second opening 1420 may penetrate the first interlayer dielectric layer 1400. In one embodiment, the first opening 1410 may expose a part of surface of the first fin 1210 and a part of surface of the isolation structure in the first region, and the second opening 1420 may expose a part of surface of the second fin 1220 and a part of surface of the isolation structure in the second region.

Figure 11:
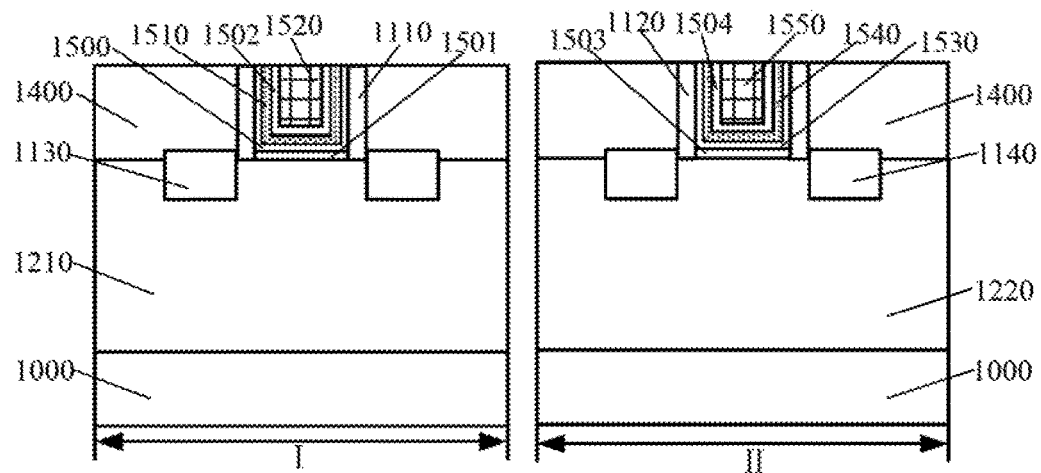

Referring to FIG. 11, a first gate dielectric layer 1500, a first work function layer 1510, a first barrier layer 1502, and a first gate electrode layer 1520 may be disposed in the first opening 1410 (illustrated in FIG. 10). The first gate dielectric layer 1500 may be disposed on side surfaces and a bottom of the first opening 1410. The first work function layer 1510 may be disposed on the first gate dielectric layer 1500. The first barrier layer 1502 may be disposed on the first work function layer 1510, and the first gate electrode layer 1520 may be disposed on the first barrier layer 1502.

Similarly, a second gate dielectric layer 1530, a second work function layer 1540, a second barrier layer 1504, and a second gate electrode layer 1550 may be disposed in the second opening 1420 (illustrated in FIG. 10). The second gate dielectric layer 1530 may be disposed on side surfaces and a bottom of the second opening 1410. The second work function layer 1540 may be disposed on the second gate dielectric layer 1530. The second barrier layer 1504 may be disposed on the second work function layer 1540, and the second gate electrode layer 1550 may be disposed on the second barrier layer 1504.

Further, before forming the first gate dielectric layer 1500, the second gate dielectric layer 1530, the first work function layer 1510, the second work function layer 1540, the first barrier layer 1502, the second barrier layer 1504, the first gate electrode layer 1520, and the second gate electrode layer 1550, a first interface layer 1501 may be formed on the bottom of the first opening 1410, and a second interface layer 1503 may be formed on the bottom of the second opening 1420. A material of the first interface layer 1501 and a material of the second interface layer 1503 may be silicon oxide.

The first gate dielectric layer 1500 and the second gate dielectric layer 1530 may form a gate dielectric layer. The first work function layer 1510 and the second work function layer 1540 may from a work function layer. The first barrier layer 1502 and the second barrier layer 1504 may form a barrier layer. The first gate electrode layer 1520 and the second gate electrode layer 1550 may form a gate electrode layer.

Because the types of the first FinFET and the second FinFET are opposite, a work function value of the first work function layer 1510 and a work function value of the second work function layer 1540 may be different.

Specifically, a gate dielectric material layer (not shown) may be formed on side surfaces and a bottom of the first opening 1410, on side surfaces and a bottom of the second opening 1420, on top surface of the first sidewall spacers 1110 and the second sidewall spacers 1120, and on top surface of the first interlayer dielectric layer 1400. A first work function material layer (not shown) may be formed covering the gate dielectric material layer. The first work function material layer in the first region may be removed, and the first work function material layer in the second region may be kept. After removing the first work function material layer in the first region, a second work function material layer (not shown) may be formed covering the first region and the second region.

Further, a third work function layer may be formed covering the second work function material layer. A barrier material layer may be formed covering the third work function material layer. A gate electrode material layer may be formed covering the barrier material layer. Then, a part of the gate dielectric material layer, a part of the first work function material layer, a part of the second work function material layer, a part of the third work function material layer, a part of the barrier material layer and a part of the gate electrode material layer above top surface of the first interlayer dielectric layer 1400 may be removed. Accordingly, the first gate dielectric layer 1500, the first work function layer 1510, the first barrier layer 1502, and the first gate electrode layer 1520 may be formed in the first opening 1410. The second gate dielectric layer 1530, the second work function layer 1540, the second barrier layer 1504, and the second gate electrode layer 1550 may be formed in the second opening 1420.

The second work function material layer and the third work function material layer in the first opening 1410 may form a first work function layer 1510. The first work function material layer, the second work function material layer, and the third work function material layer in the second opening 1420 may form a second work function layer 1540. The first gate dielectric layer 1500 and the second gate dielectric layer 1530 may correspond to the gate dielectric material layer. The first barrier layer 1502 and the second barrier layer 1504 may correspond to the barrier material layer. The first gate electrode layer 1520 and the second gate electrode layer 1550 may correspond to the gate electrode material layer.

In particular, the material of the first gate dielectric layer 1500 and the material of the second gate dielectric layer 1530 may be a high-K dielectric material (K>3.9), such as $HfO_2$, $La_2O_3$, HfSiON, $HfAlO_2$, $ZrO_2$, $Al_2O_3$, $La_2O_3$, $HfSiO_4$.

A material of the first work function material layer, a material of the second work function material layer, and a material of the third work function material layer may be Ti, Ta, TiN, TaN, TiAl, TaSiN, TiSiN, TiAlN, or TaAlN. Further, the first work function material layer and the second work function material layer may be made of the same material, and the material of the first and second work function material layers may be different from the material of the third work function material layer. In one embodiment, the first work function material layer and the second work function material layer may be made of TiN, and the third work function material layer may be made of TiAl.

The first barrier layer 1502 and the second barrier layer 1504 may be TiN, TaC, TaN, HfN, or ZrN. The first barrier layer 1502 may prevent atoms in the first gate electrode layer 1520 from diffusing to the first interlayer dielectric layer 1400 and the first gate dielectric layer 1500. The second barrier layer 1504 may prevent atoms in the second gate electrode layer 1550 from diffusing to the first interlayer dielectric layer 1400 and the second gate dielectric layer 1530. In particular, a material of the first gate electrode layer 1520 and the second gate electrode layer 1550 may be Al, Cu, Ag, Au, Ni, Ti, W, WN or WSi.

Further, the first work function layer 1510 and the first barrier layer 1502 on two side surfaces of the first gate electrode layer 1520 may be removed to form first grooves. The second work function layer 1540 and the second barrier layer 1504 on two side surfaces of the second gate electrode layer 1550 may be removed to form second grooves. Further, the first grooves and the second grooves may be formed simultaneously, or may be formed in different steps.

A process to remove the first work function layer 1510 and the first barrier layer 1502 on the two side surfaces of the first gate electrode layer 1520 may be an anisotropic dry etching process, or a wet etching process. Similarly, a process to remove the second work function layer 1540 and the second barrier layer 1504 on two side surfaces of the second gate electrode layer 1550 may be an anisotropic dry etching process, or a wet etching process.

Figure 12:
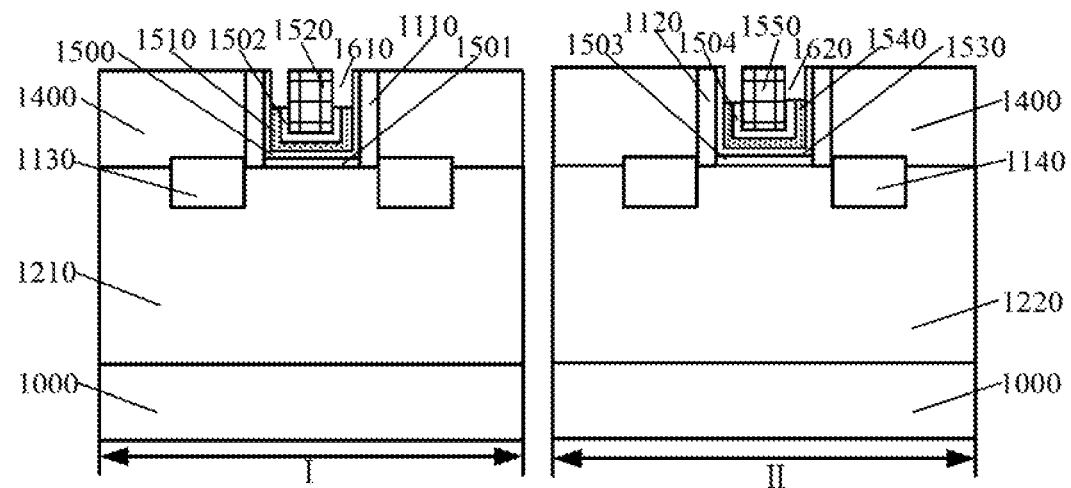

In one embodiment, referring to FIG. 12, a part of the first work function layer 1510 and a part of the first barrier layer 1502 on two side surfaces of the first gate electrode layer 1520 may be removed, and a part of the second work function layer 1540 and a part of the second barrier layer 1504 on two side surfaces of the second gate electrode layer 1550 may be removed for illustrative purpose, thus forming first grooves 1610 in the first region, and forming second grooves 1620 in the second region.

In other embodiments, the whole first work function layer 1510 and the whole first barrier layer 1502 on two side surfaces of the first gate electrode layer 1520 may be removed to form the first grooves. The whole second work function layer 1540 and the whole second barrier layer 1504 on two side surfaces of the second gate electrode layer 1550 may be removed to form the second grooves.

Further, in other embodiments, the first barrier layer and the second barrier layer may not be formed. Thus, the first grooves may be formed by removing the first work function layer on two side surfaces of the first gate electrode layer, and the second grooves may be formed by removing the second work function layer on two side surfaces of the second gate electrode layer.

When the first barrier layer and the second barrier layer are not formed, in one embodiment, a part of the first work function layer on two side surfaces of the first gate electrode layer may be removed to form the first grooves, and a part of the second work function layer on two side surfaces of the second gate electrode layer may be removed to form the second grooves. In another embodiment, the whole first work function layer on two side surfaces of the first gate electrode layer may be removed to form the first grooves, and the whole second work function layer on two side surfaces of the second gate electrode layer may be removed to form the second grooves.

Figure 13:
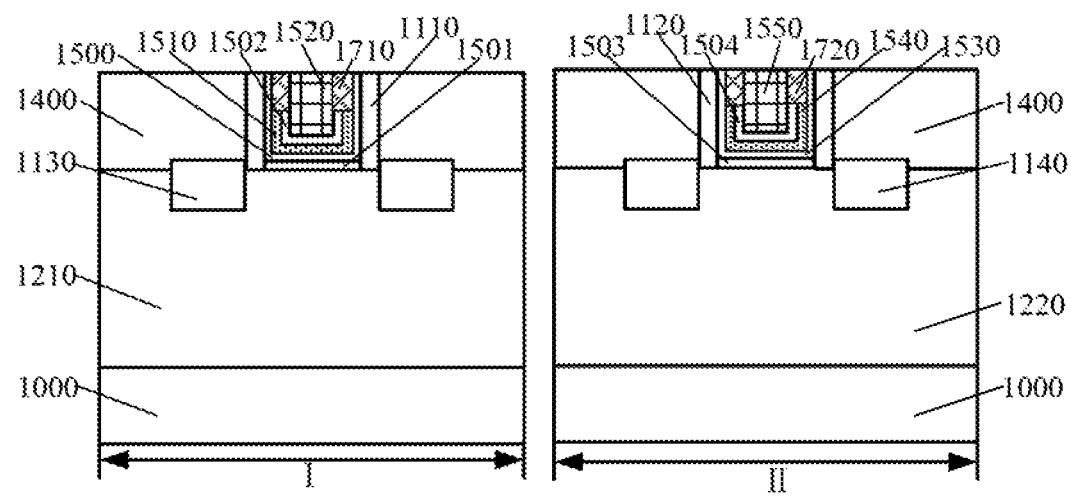

Further, referring to FIG. 13, a first protection layer 1710 may be formed in the first grooves 1610, and a second protection layer 1720 may be formed in the second grooves 1620. The first protection layer 1710 and the second protection layer 1720 may form a protection layer. A process to form the first protection layer 1710 and the second protection layer 1720 may refer to the process that forms the protection layer 270, which is not described in detail here.

The electrical conductivity of the first protection layer 1710 may be lower than the electrical conductivity of the first work function layer 1510, and the electrical conductivity of the second protection layer 1720 may be lower than the electrical conductivity of the second work function layer 1540. A material of the first protection layer 1710 and the second protection layer 1720 may be silicon nitride, silicon oxide, silicon oxynitride, or silicon carbide.

The first protection layer 1710 may be disposed on two side surfaces of the first gate electrode layer 1520, and on top surface of the first work function layer 1510 and on top surface of the first barrier layer 1502. The second protection layer 1720 may be disposed on two side surfaces of the second gate electrode layer 1550, and on top surface of the second work function layer 1540 and on top surface of the second barrier layer 1504.

In other embodiments, when the first barrier layer and the second barrier layer are not formed, the first protection layer may be disposed on two side surfaces of the first gate electrode layer and on the top surface of the first work function layer. The second protection layer may be disposed on two side surfaces of the second gate electrode layer and on the top surface of the second work function layer.

Then, the second interlayer dielectric layer (not shown) may be formed covering the first interlayer dielectric layer 1400, the first gate dielectric layer 1500, the second gate dielectric layer 1530, the first protection layer 1710, the second protection layer 1720, the first gate electrode layer 1520, and the second gate electrode layer 1550. The second interlayer dielectric layer may further cover the first sidewall spacers 1110 and the second sidewall spacers 1120.

If the material of the second interlayer dielectric layer is the same as the material of the first protection layer 1710 and the second protection layer 1720, the second interlayer dielectric layer, the first protection layer 1710, and the second protection layer 1720 may be formed in the same deposition step, thus simplifying the process.

After forming the second interlayer dielectric layer, first through-holes (not shown) may be formed in the first region penetrating the second interlayer dielectric layer and the first interlayer dielectric layer 1400. The first through-holes may expose substrate surface on two sides of the first gate dielectric layer 1500, the first work function layer 1510, the first barrier layer 1502, the first protection layer 1710, and the first gate electrode layer 1520. Specifically, the first though-holes may expose the surface of the first source/drain regions 1130.

Second through-holes (not shown) may be formed in the second region penetrating the second interlayer dielectric layer and the first interlayer dielectric layer 1400. The second through-holes may expose substrate surface on two sides of the second gate dielectric layer 1530, the second work function layer 1540, the second barrier layer 1504, the second protection layer 1720, and the second gate electrode layer 1550. Specifically, the second though-holes may expose the surface of the second source/drain regions 1140. Further, after forming the first through-holes and the second through-holes, first conductive plugs may be formed in the first through-holes, and second conductive plugs may be formed in the second through-holes.

Because the first protection layer is formed in the first grooves and the second protection layer is formed in the second grooves, the first protection layer may replace the first work function layer on two side surfaces of the first gate electrode layer, and the second protection layer may replace the second work function layer on two side surfaces of the second gate electrode layer. Thus, the first interlayer dielectric layer and the first protection layer may be sandwiched between the first gate electrode layer and the first conductive plugs, and the second interlayer dielectric layer and the second protection layer may be sandwiched between the second gate electrode layer and the second conductive plugs.

Because the electrical conductivity of the first protection layer is smaller than the electrical conductivity of the first work function layer and the electrical conductivity of the second protection layer is smaller than the electrical conductivity of the second work function layer, insulating performance of the first protection layer may be better than insulating performance of the first work function layer, and insulating performance of the second protection layer may be better than insulating performance of the second work function layer.

Thus, the insulating performance of the material between the first gate electrode layer and the first conductive plugs may be improved, and the insulating performance of the material between the second gate electrode layer and the second conductive plugs may be improved. Accordingly, the first gate electrode layer and the first conductive plugs may be better isolated, and the second gate electrode layer and the second conductive plugs may be better isolated, thus improving the electrical properties of the transistor.

Further, only the first work function layer disposed on two side surfaces of the first gate electrode layer and the second work function layer disposed on two side surfaces of the second gate electrode layer may be removed. The first work function layer on the bottom of the first gate electrode layer may remain unchanged, and the second work function layer on the bottom of the second gate electrode layer may remain unchanged.

Because the region in the first work function layer that affects the threshold voltage of the transistor in the first region is located on the bottom of the first gate electrode layer, the threshold voltage of the transistor in the first region may not be affected. Further, because the region in the second work function layer that affects the threshold voltage of the transistor in the second region is located on the bottom of the second gate electrode layer, the threshold voltage of the transistor in the second region may not be affected Correspondingly, the present disclosure also provides a transistor fabricated using the above method. Referring to FIG. 13, the transistor may include a substrate including a first region (region I) and a second region (region II), a first interlayer dielectric layer 1400 disposed on surface of the substrate, openings penetrating the first interlayer dielectric layer 1400, work function layers, gate electrode layers, and protection layers. In particular, the substrate may include a semiconductor substrate 1000 and fins disposed on surface of the semiconductor substrate 1000. The fins may include a first fin 1210 in the first region and a second fin 1220 in the second region.

Further, the openings may include a first opening 1410 (illustrated in FIG. 10) disposed in the first region and a second opening 1420 (illustrated in FIG. 10) disposed in the second region. The first opening 1410 may expose a part of the top surface and side surfaces of the first fin 1210. The second opening 1420 may expose a part of the top surface and side surfaces of the second fin 1220.

The work function layers may include a first work function layer 1510 and a second work function layer 1540. The first work function layer 1510 may be disposed on the bottom and a part of the side surfaces of the first opening 1410. The second work function layer 1540 may be disposed on the bottom and a part of side surfaces of the second opening 1420.

The gate electrode layers may include a first gate electrode layer 1520 and a second gate electrode layer 1550. The first gate electrode layer 1520 may be disposed in the first opening 1410 and on the first work function layer 1510. The second gate electrode layer 1550 may be disposed in the second opening 1420 and on the second work function layer 1540.

The protection layer may include a first protection layer 1710 and a second protection layer 1720. The first protection layer 1710 may be disposed on two side surfaces of the first gate electrode layer 1520 and on top surface of the first function layer 1510. The second protection layer 1720 may be disposed on two side surfaces of the second gate electrode layer 1550 and on top surface of the second work function layer 1540. A material of the first protection layer 1710 and the second protection layer 1720 may be silicon nitride, silicon oxide, silicon oxynitride, or silicon carbide.

Further, the electrical conductivity of the first protection layer may be smaller than the electrical conductivity of the first work function layer 1510. The electrical conductivity of the second protection layer may be smaller than the electrical conductivity of the second work function layer 1540. The first protection layer 1710 may be disposed on a part of the two side surfaces of the first gate electrode layer 1520 or on the whole two side surfaces of the first gate electrode layer 1520. The second protection layer 1720 may be disposed on a part of the two side surfaces of the second gate electrode layer 1550 or on the whole two side surfaces of the second gate electrode layer 1550.

A first gate dielectric layer 1500 may be formed between the first work function layer 1510 and the first region of the substrate, and between the first work function layer 1510 and the first interlayer dielectric layer 1400. A second gate dielectric layer 1530 may be formed between the second work function layer 1540 and the second region of the substrate, and between the second work function layer 1540 and the first interlayer dielectric layer 1400. In other embodiments, a first gate dielectric layer may be formed between the first work function layer and the first region of the substrate, and a second gate dielectric layer may be formed between the second work function layer and the second region of the substrate.

A first interface layer 1501 may be disposed between the first gate dielectric layer 1500 and the first region of the substrate, and a second interface layer 1503 may be disposed between the second gate dielectric layer 1530 and the second region of the substrate. In other embodiments, both the first interface layer 1501 and the second interface layer 1503 may not exist.

The transistor may also include barrier layers. The barrier layers may include a first barrier layer 1502 and a second barrier layer 1504. The first barrier layer 1502 may be disposed between the first work function layer 1510 and the first gate electrode layer 1520, and the second barrier layer 1504 may be disposed between the second work function layer 1540 and the second gate electrode layer 1550.

Because the transistor includes the first barrier layer 1502 and the second barrier layer 1504, the first protection layer 1710 may be disposed on two side surfaces of the first gate electrode layer 1520, on top surface of the first work function layer 1510 and on top surface of the first barrier layer 1502. The second protection layer 1720 may be disposed on two side surfaces of the second gate electrode layer 1550, on top surface of the second work function layer 1540 and on top surface of the second barrier layer 1504.

The transistor may further include first sidewall spacers 1110, second sidewall spacers 1120, first source/drain regions 1130, second source/drain regions 1140, a second interlayer dielectric layer (not shown) and first conductive plugs (not shown). In particular, the first sidewall spacers 1110 may be disposed between the first interlayer dielectric layer 1400 and the first work function layer 1510 in the first region, and the second sidewall spacers 1120 may be disposed between the first interlayer dielectric layer 1400 and the second work function layer 1540. Specifically, the first sidewall spacers 1110 may be disposed between the first interlayer dielectric layer 1400 and the first gate dielectric layer 1500. The second sidewall spacers 1120 may be disposed between the first interlayer dielectric layer 1400 and the second gate dielectric layer 1530.

The first source/drain regions 1130 may be disposed on two sides of the first gate dielectric layer 1500, the first work function layer 1510, the first protection layer 1710, the first barrier layer 1502, the first gate electrode layer 1520, and the first sidewall spacers 1110 in the first fin 1210. The second source/drain regions 1140 may be disposed on two sides of the second gate dielectric layer 1530, the second work function layer 1540, the second protection layer 1720, the second barrier layer 1504, the second gate electrode layer 1550, and the second sidewall spacers 1120 in the second fin 1220.

The second interlayer dielectric layer (not shown) may cover the first interlayer dielectric layer 1400, the first sidewall spacers 1110, the second sidewall spacers 1120, the first gate dielectric layer 1500, the second gate dielectric layer 1530, the first protection layer 1710, the second protection layer 1720, the first gate electrode layer 1520, and the second gate electrode layer 1550.

The first conductive plugs (not shown) may penetrate the first interlayer dielectric layer 240 and the second interlayer dielectric layer in the first region, and be disposed on the first source/drain regions 1130. The second conductive plugs (not shown) may penetrate the first interlayer dielectric layer 240 and the second interlayer dielectric layer in the second region, and be disposed on the second source/drain regions 1140.

In a transistor provided by another embodiment of the present disclosure, a first protection layer may be disposed on side surfaces of the first gate electrode layer, and a second protection layer may be disposed on side surfaces of the second gate electrode layer. Further, the first protection layer may be disposed on top surface of the first work function layer, and the second protection layer may be disposed on top surface of the second work function layer.

Because the electrical conductivity of the first protection layer is smaller than the electrical conductivity of the first work function layer, insulating performance of the first protection layer may be better than that of the first work function layer. Similarly, because the electrical conductivity of the second protection layer is smaller than the electrical conductivity of the second work function layer, the insulating performance of the second protection layer may be better than that of the second work function layer.

Thus, the insulating performance of the material between the first gate electrode layer and the first conductive plugs may be improved, and the insulating performance of the material between the second gate electrode layer and the second conductive plugs may be improved. Accordingly, the electrical properties of the transistor may be improved.

Though the present disclosure is disclosed above, the present disclosure is not limited thereto. Any equivalent or modification thereof, without departing from the spirit and principle of the present disclosure, falls within the true scope of the present disclosure, and the scope of the present disclosure is defined by the appended claims.

What is claimed is:

1. A method of forming a transistor, comprising:
   forming a first interlayer dielectric layer on a substrate;
   forming an opening through the first interlayer dielectric layer;
   forming a work function layer over side surfaces and a bottom of the opening;
   forming a barrier layer over the work function layer;
   forming a gate electrode layer over the barrier layer;
   removing at least a portion of the work function layer and at least a portion of the barrier layer over side surfaces of the gate electrode layer to form grooves; and
   forming a protection layer in the grooves, wherein a top surface of the protection layer is coplanar with a top surface of the gate electrode layer and a bottom surface of the protection layer is leveled with a top surface of the barrier layer and a top surface of the work function layer.

2. The method according to claim 1, wherein:
   the protection layer is made of a material including one or more selected from silicon nitride, silicon oxide, silicon oxynitride, and silicon carbide.

3. The method according to claim 1, wherein:
   the protection layer is formed by one of a plasma enhanced chemical vapor deposition process, a plasma enhanced atomic layer deposition, and a high-density plasma chemical vapor deposition process.

4. The method according to claim 1, wherein:
   the protection layer has an electrical conductivity less than the work function layer.

5. The method according to claim 1, wherein:
a remaining portion of the work function layer on the side surfaces of the gate electrode layer is removed to form the grooves.

6. The method according to claim 1, wherein:
the at least a portion of the work function layer is removed by an anisotropic dry etching process, or a wet etching process.

7. The method according to claim 1, wherein:
a gate dielectric layer is formed between the work function layer and the substrate.

8. The method according to claim 1, further comprising:
forming a second interlayer dielectric layer covering the first interlayer dielectric layer, the protection layer and the gate electrode layer;
forming through-holes through the second interlayer dielectric layer and the first interlayer dielectric layer, wherein the through-holes expose a substrate surface on two sides of the gate electrode layer; and
forming conductive plugs in the through-holes.

9. A method of forming a transistor, comprising:
providing a substrate including a first region and a second region;
forming a first interlayer dielectric layer on the substrate;
forming a first opening in the first region and a second opening in the second region through the first interlayer dielectric layer;
forming a first work function layer over side surfaces and a bottom of the first opening and a second work function layer over side surfaces and a bottom of the second opening;
forming a first barrier layer on the first work function layer and a second barrier layer on the second work function layer;
forming a first gate electrode layer over the first barrier layer and a second gate electrode layer over the second barrier layer;
removing at least a portion of the first work function layer and at least a portion of the first barrier layer on side surfaces of the first gate electrode layer to form the first plurality of grooves,
removing at least a portion of the second work function layer and at least a portion of the second barrier layer on side surfaces of the second gate electrode layer to form the second plurality of grooves; and
forming a first protection layer in the first plurality of grooves and forming a second protection layer in the plurality of second grooves.

10. The method according to claim 9, wherein:
a first gate dielectric layer is sandwiched between the first work function layer and the first region of the substrate; and
a second gate dielectric layer is sandwiched between the second work function layer and the second region of the substrate.

11. The method according to claim 1, wherein:
a top surface of a remaining portion of the barrier layer is coplanar with a top surface of a remaining portion of the work function layer.

12. The method according to claim 1, wherein before forming the work function layer over the side surfaces and the bottom of the opening, an interface layer is formed on the bottom of the opening.

13. The method according to claim 3, wherein the plasma enhanced chemical vapor deposition process comprises:
a flow rate of TEOS in a range from about 4 g/min to 8 g/min;
a flow rate of $O_2$ in a range from 3500 sccm to 5000 sccm;
a radio-frequency power in a range from 800 W to 1500 W;
a chamber pressure in a range from of about 5 torr to 10 torr; and
a temperature in a range from 350° C. to 410° C.

* * * * *